US008664727B2

(12) United States Patent
Harada

(10) Patent No.: US 8,664,727 B2
(45) Date of Patent: Mar. 4, 2014

(54) SEMICONDUCTOR INTEGRATED CIRCUIT DEVICE

(75) Inventor: Hirofumi Harada, Chiba (JP)

(73) Assignee: Seiko Instruments Inc. (JP)

( * ) Notice: Subject to any disclaimer, the term of this patent is extended or adjusted under 35 U.S.C. 154(b) by 158 days.

(21) Appl. No.: 12/613,081

(22) Filed: Nov. 5, 2009

(65) Prior Publication Data

US 2010/0127334 A1   May 27, 2010

(30) Foreign Application Priority Data

Nov. 26, 2008   (JP) .................................. 2008-300715

(51) Int. Cl.
*H01L 27/088* (2006.01)
(52) U.S. Cl.
USPC ........... 257/368; 257/231; 257/371; 257/401; 257/E29.026; 257/E29.027
(58) Field of Classification Search
USPC ......... 257/213, 365, 368, 369, 371, 231, 401, 257/E29.026, E29.027, E25.016
See application file for complete search history.

(56) References Cited

U.S. PATENT DOCUMENTS

2006/0118882 A1*   6/2006   Kitahara ...................... 257/371

FOREIGN PATENT DOCUMENTS

| JP | 06-268453 A | 9/1994 |
| JP | 09-266257 A | 10/1997 |
| JP | 2003-243529 A | 8/2003 |

* cited by examiner

*Primary Examiner* — Ha Tran T Nguyen
*Assistant Examiner* — Suberr Chi
(74) *Attorney, Agent, or Firm* — Brinks Gilson & Lione

(57) ABSTRACT

Provided is a semiconductor integrated circuit device capable of realizing an analog circuit required to have a high-precision relative ratio between adjacent transistors, which is reduced in size and cost. A single MOS transistor is provided within each of well regions. A plurality of the MOS transistors is combined to serve as an analog circuit block. Since distances between the well regions and channel regions may be made equal to one another, a high-precision semiconductor integrated circuit device can be obtained.

2 Claims, 5 Drawing Sheets

SEMICONDUCTOR INTEGRATED CIRCUIT DEVICE

RELATED APPLICATIONS

This application claims priority under 35 U.S.C. §119 to Japanese Patent Application No. JP2008-300715 filed Nov. 26, 2008, the entire content of which is hereby incorporated by reference.

BACKGROUND OF THE INVENTION

1. Field of the Invention

The present invention relates to a semiconductor integrated circuit device including an analog signal processing circuit having MOS transistors.

2. Description of the Related Art

In a semiconductor integrated circuit, in particular, in an analog signal processing circuit, which includes MOS transistors, difference in characteristics between adjacent MOS transistors is required to be small enough. The analog signal processing circuit includes an operational amplifier and a current mirror circuit, and has a function of producing a plurality of current sources with a certain ratio to compare and amplify a plurality of voltages with high precision. Having the same structure and layout the MOS transistors, which are used for the analog signal processing circuit, are assumed to have the same threshold voltage, mutual conductance, and sub-threshold characteristics including a leak current, as a precondition to circuit operation. Differences among the characteristics generate an offset voltage in the operational amplifier and a current error in the current mirror circuit, giving possible degradation to the product characteristics itself.

Accordingly, in order to produce the plurality of MOS transistors which are required to have the same characteristics, various measures are taken, including not only a method of equalizing fundamental device parameters, such as adjusting a channel length, a channel width, a contact shape, and a distance between a contact and a channel to the same values, but also typical other methods such as a method of aligning channel directions, a method of minimizing a distance between MOS transistors, and a method of producing a circuit having a plurality of MOS transistors which are cross-coupled. In order to suppress a deviation in threshold voltage, the channel length and the channel width are generally extended to minimize a variation in characteristics due to a deviation in size caused during a manufacturing process.

These measures accompany increase of the device size and of the circuit area, opposing reduction in cost and size. In particular, when the scale of the analog signal processing circuit becomes larger, the trade-off becomes significant, and hence it is difficult to obtain benefits from a miniaturization technology used for a digital signal processing circuit. In addition, in a case of a digital and analog mixed IC, a process combination between them may also be limited in some cases.

Parameters such as gate oxide film thickness and channel impurity concentration are main candidates for affecting the variation in characteristics and deviation of a MOS transistor. However, technologies accompanying the device miniaturization, on the other hand, have an aspect of suppressing the variation in characteristics of the MOS transistor. For example, the gate oxide film thickness giving a dominant effect to the characteristics of the MOS transistor is less likely to become a factor for characteristics variation along with the improvement in film thickness control.

The improvement of patterning control during a photolithography process and an etching process directly leads to a reduction in size deviation, suppressing the variation in characteristics due to a shape effect caused by reduction of the device size, and hence becomes a technology for accelerating the reductions in size and cost.

With the above mentioned progress of the technologies in the background, the variation in channel concentration, in particular, the variation in concentration of a well region formed in a semiconductor substrate is an increasing factor of the variation of characteristics of a MOS transistor.

FIG. 2 illustrates a conventional semiconductor integrated circuit device. A normal two-dimensional arrangement of MOS transistors is described with reference to FIG. 2. P-type and N-type well regions are formed in a P-type semiconductor substrate. P-channel MOS transistors 101 are normally formed within an N-type well region 6. Therefore, a plurality of P-channel MOS transistors 101 are grouped for a single circuit block and arranged adjacent to each other within the single N-type well region 6 of the semiconductor substrate. Similarly, N-channel MOS transistors 102 are arranged for a single circuit block adjacent to each other within the predetermined P-type well region 5.

In this case, the P-channel MOS transistors 101 are particularly arranged within the N-type well region 6 having a finite space, and hence a device may be arranged close to a boundary between the N-type well region 6 and the P-type well region 5.

An analog circuit block is desired to have a uniform characteristic without a variation in respective transistor characteristics. Therefore, it is necessary to obtain a uniform impurity concentration within the same N-type well region.

Methods of reducing the variation in transistor characteristics in the analog circuit are disclosed in, for example, JP 06-268453 A, JP 09-266257 A, and JP 2003-243529 A.

However, the conventional well region formation method using the semiconductor process as described above has the following problem. The thermal treatment for forming the oxide film is performed after the impurity implantation for forming the N-type well region. During the thermal treatment, a concentration of a boundary portion of the N-type well region is changed by diffusion. To be specific, the impurity is diffused in the lateral direction, and hence the concentration of the boundary region reduces. The thermal treatment is further performed as compared to the case of forming the P-type well region. Therefore, the degree of reduction in concentration of the vicinity of the boundary portion of the N-type well region is larger than the degree of reduction in concentration of the vicinity of the boundary portion of the P-type well region.

Thus, the MOS transistors arranged close to the boundary regions, in particular, the P-channel MOS transistor 101 located on the N-type well region side 6 as shown in FIG. 2 is more likely to cause the variation in characteristic due to the change in concentration.

SUMMARY OF THE INVENTION

In order to solve the above-mentioned problems, the present invention is made as follows. That is, a semiconductor integrated circuit device according to one aspect of the present invention includes: a semiconductor substrate having a first conductivity type; a well region having the first conductivity type and a well region having a second conductivity type, which are formed in different regions of the semiconductor substrate; a first MOS transistor formed on the well region having the first conductivity type; and a second MOS transistor formed on the well region having the second conductivity type, in which a plurality of the second MOS transistors are provided as a group in a case where a single second MOS transistor is formed on each well region having the second conductivity type.

Further, in the semiconductor integrated circuit device according to the one aspect of the present invention, a distance between an edge of the well region having the second conductivity type and a channel region edge of the second MOS transistor formed on the well region having the second conductivity type is 2 μm to 5 μm.

A semiconductor integrated circuit device according to another aspect of the present invention includes; a semiconductor substrate having a first conductivity type; a well region having the first conductivity type and a well region having a second conductivity type, which are formed in different regions of the semiconductor substrate; a first MOS transistor formed on the well region having the first conductivity type; and a second MOS transistor formed on the well region having the second conductivity type, in which a plurality of the first MOS transistors are provided as a group in a case where a single first MOS transistor is formed on each well region having the first conductivity type, and a plurality of the second MOS transistors are provided as a group in a case where a single second MOS transistor is formed on each well region having the second conductivity type.

Further, in the semiconductor integrated circuit device according to the another aspect of the present invention, a distance between an edge of each well region having the first conductivity type and a channel region edge of the first MOS transistor is 2 μm to 5 μm, and a distance between an edge of each well region having the second conductivity type and a channel region edge of the second MOS transistor is 2 μm to 5 μm.

According to the present invention, a semiconductor integrated circuit device including an analog circuit which has a small variation in characteristic of each MOS transistor and is reduced in size and cost may be provided.

DETAILED DESCRIPTION OF THE PREFERRED EMBODIMENTS

Figure 1:
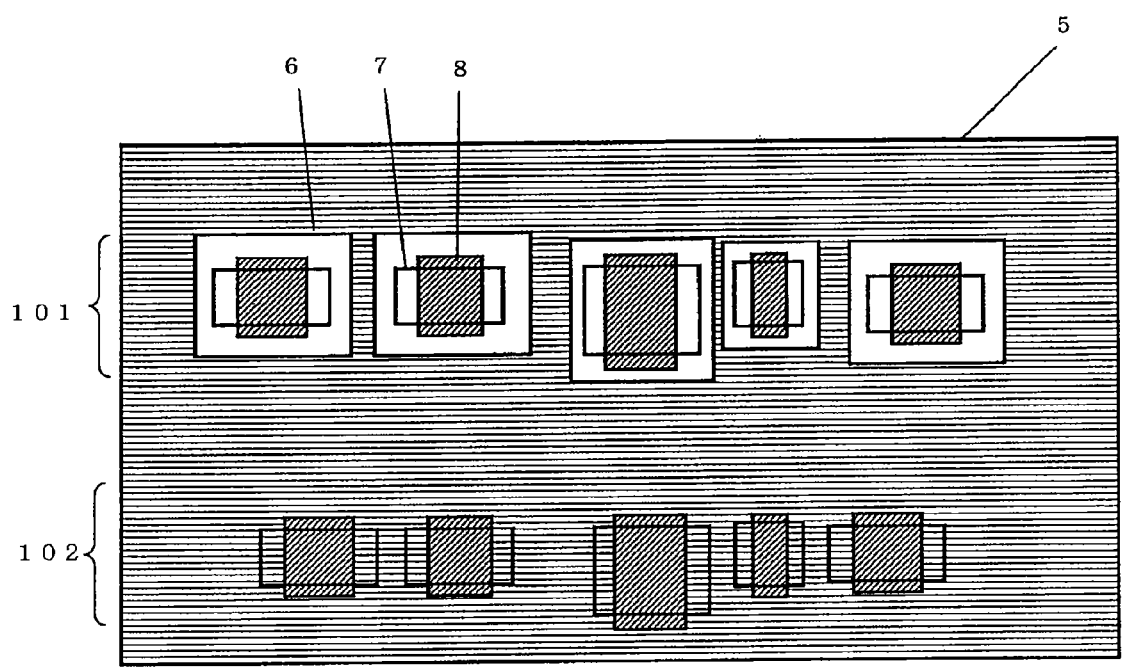
FIG. 1 is a schematic plan view illustrating a semiconductor integrated circuit device according to a first embodiment of the present invention.
Figure 2:
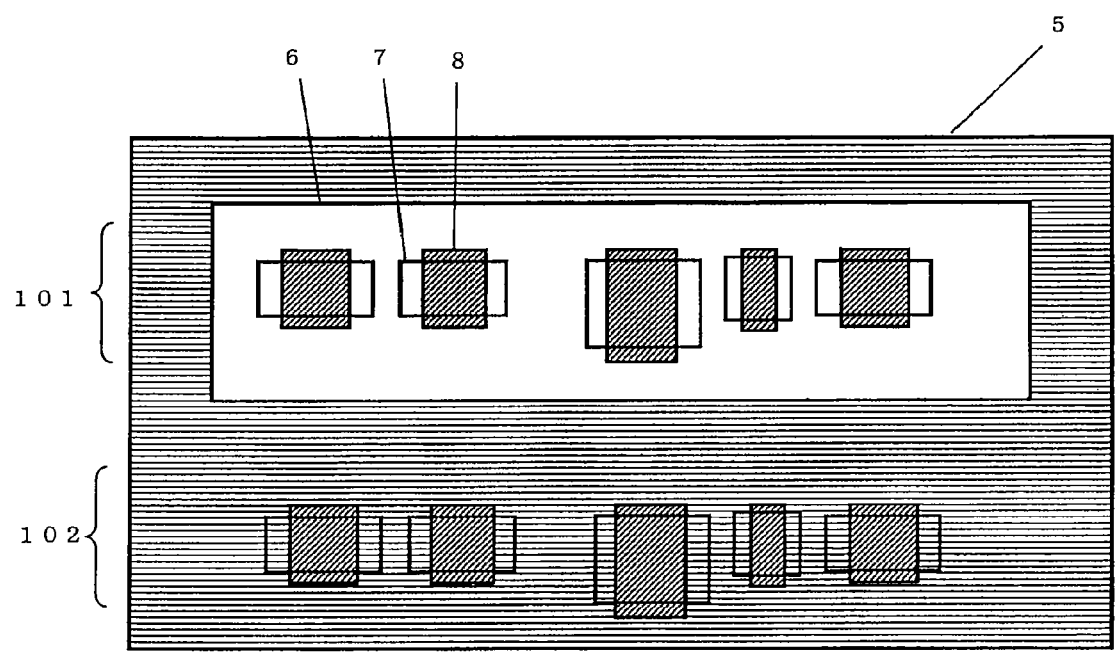
FIG. 2 is a schematic plan view illustrating a conventional semiconductor integrated circuit device.
Figure 4A:
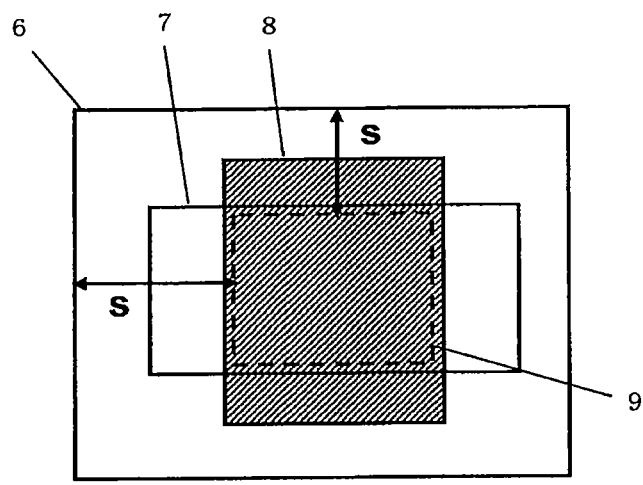
FIG. 4A is a schematic plan view illustrating a P-channel MOS transistor and FIG. 4B is a graph illustrating a relationship of a threshold voltage and distances between a channel region and an edge of a well region.

Hereinafter, embodiments of the present invention are described with reference to the attached drawings. FIG. 1 is a schematic plan view illustrating a semiconductor integrated circuit device in which a variation in characteristics of MOS transistors is reduced, according to a first embodiment of the present invention. In FIG. 2 illustrating the conventional method, the plurality of P-channel MOS transistors 101 are arranged within the single N-type well region 6. In contrast to this, according to the present invention, a single P-channel MOS transistor 101 is provided within each of N-type well regions 6. Within each of N-type well regions 6, a P-type well region 7 is arranged. The provided P-channel MOS transistors 101 serve as a circuit block. In this case, all the P-channel MOS transistors 101 are adjusted such that distances between channel regions and edges of the N-type well regions 6 under polysilicon gate electrodes 8 are equal to one another. When the enlarged view of FIG. 4A is referred to, the distance between the channel region 9 and the N type well region 6 is easily recognized. A feature of the present invention resides in that the illustrated distances S between the channel region 9 and the N-type well region 6 are made equal to each other. The N-type well region is provided such that the distance S in the lateral direction of FIG. 4A is equal to the distance S in the longitudinal direction of FIG. 4A. In addition, the N-type well region is provided such that the distances S in the plurality of P-channel MOS transistors are equal to one another. In so doing, the following advantages are obtained.

When there is a variation in characteristics due to a reduction in concentration at the edge of the N-type well region 6, the P-channel MOS transistors 101 are equally affected. Accordingly, a relative ratio between characteristic values does not change even when an absolute variation occurs in a characteristic value. This is the most desired feature of an analog circuit, such as an operational amplifier or a current mirror circuit, which is required to have the most precise characteristic ratio between adjacent MOS transistors.

In order to suppress the variation in characteristics of the P-channel MOS transistors used for the analog circuit, it is unnecessary to form the P-channel MOS transistors inside the N-type well region at a sufficient distance from the edge of the N-type well region. Further, the precision of the MOS transistor characteristic ratio in the present invention is increased, and hence it is unnecessary to employ characteristic variation suppression measures including a cross-coupled layout of the MOS transistors. The points described above contribute to a simplified circuit, a reduced size, and a reduced cost.

To be specific, according to the conventional layout as illustrated in FIG. 2, the P-channel MOS transistors used for the analog circuit need to be located at a distance of at least 5 μm between the channel region 9 and the edge of the N-type well region 6. In the case of the present invention, since the variations in characteristics of all the P-channel MOS transistors become equal to one another, no problem occurs even when the distance is reduced to 2 μm in a case of a process specified to operate at 5 volts. When the distance is smaller than 2 μm, a withstand voltage at the source and drain regions lowers in the case of the process specified for 5-volt operation. In a case of a process specified to operate at a lower voltage, the distance may be further reduced.

The method described above is not limited to the N-type well region 6 formed in the P-type semiconductor substrate 1 and the P-channel MOS transistors 101 formed on the N-type well region 6. Therefore, the method may be applied to the P-type well region 5 formed in the P-type semiconductor substrate 1 and the N-channel MOS transistors 102 formed on the P-type well region 5. The method may be also applied to well regions and MOS transistors which are provided for an N-type semiconductor substrate. Thus, the same effect may be obtained.

A method of forming a well region, which significantly affects the characteristics of the MOS transistor, is described with reference to FIGS. 3A to 3E. Hereinafter, a method of forming a P-type well region and an N-type well region in a P-type semiconductor substrate is described.

Figure 3A:
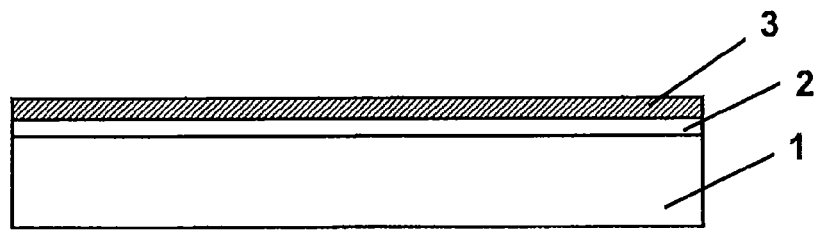
FIGS. 3A to 3E are principal cross sectional views illustrating respective steps for forming well regions.

First, as illustrated in FIG. 3A, a laminated structure of a silicon oxide film 2 and a silicon nitride film 3 is formed on a semiconductor substrate 1 by using thermal oxidation and low-pressure chemical vapor deposition (LPCVD) respectively.

Figure 3B:
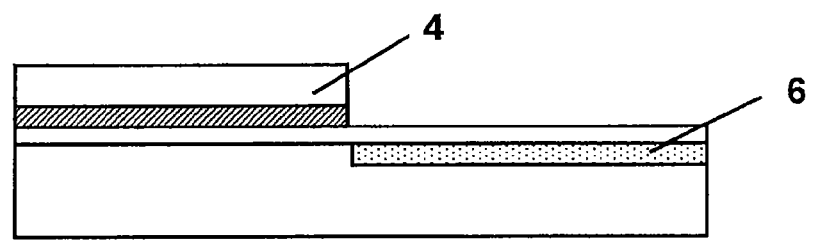

Next, as illustrated in FIG. 3B, a portion of the silicon nitride film 3 which is located above a region to serve as an N-type well region 6 is etched. A photoresist 4 and a remaining portion of the silicon nitride film 3 are used as masks to implant an impurity into the semiconductor substrate through the silicon oxide film 2 by an ion implantation method. The impurity to be used is arsenic or phosphorus and the amount of implantation is arbitrarily selected from a range of $1\times10^{12}/\text{cm}^2$ to $1\times10^{14}/\text{cm}^2$.

Figure 3C:
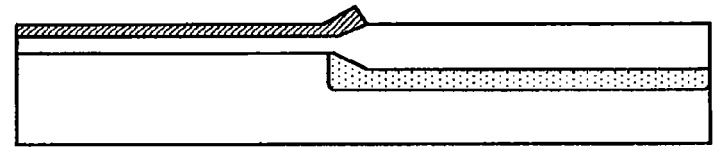

Next, as illustrated in FIG. 3C, the photoresist is peeled off, and then the remaining portion of the silicon nitride film is used as a mask to selectively thicken a portion of the silicon oxide film which is located on the N-type well region, by thermal oxidation.

Figure 3D:
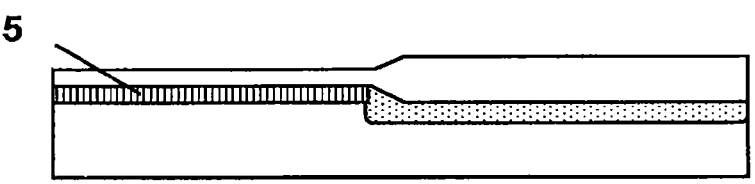

Next, as illustrated in FIG. 3D, the remaining portion of the silicon nitride film is peeled off, and then the thick portion of the silicon oxide film which is located on the N-type well region 6 is used as a mask to implant a P-type impurity such as boron or $BF_2$ into the semiconductor substrate by an ion implantation method. As in the case of the N-type well region, the amount of implantation is arbitrarily selected from a range of $1\times10^{12}/\text{cm}^2$ to $1\times10^{14}/\text{cm}^2$. According to such a method, a region other than the N-type well region 6 may be formed as a P-type well region 5.

Figure 3E:
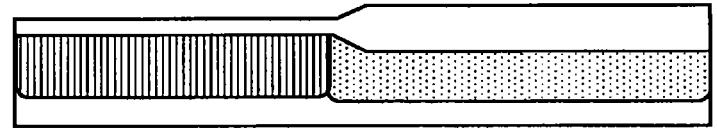

Finally, as illustrated in FIG. 3E, the N-type impurity and the P-type impurity are diffused to a predetermined depth from the surface of the semiconductor substrate by thermal treatment at a high temperature equal to or higher than 1,100° C. The temperature of the thermal diffusion may often be the highest in all semiconductor processes, and hence the impurity concentrations of the well regions may not be substantially varied during subsequent semiconductor processes.

The N-type well region and the P-type well region are located such that the impurities with the same concentration are adjacent to each other. Therefore, a position of a boundary between the well regions is not shifted by the high-temperature thermal diffusion and a change in concentration at the boundary is steep in each of the well regions.

In other words, a deviation in concentrations of the N-type well region and the P-type well region which are formed by the method as described above depends on deviations in ion implantation amounts, film thicknesses of the deposited films, and thermal treatments during the steps illustrated in FIGS. 3A to 3E.

Figure 4B:
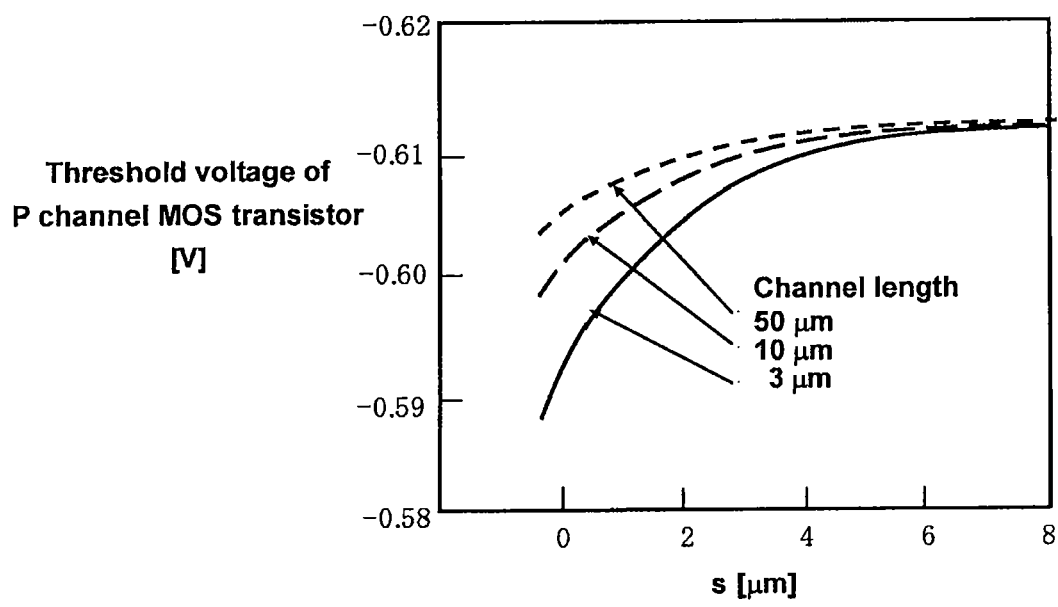

FIG. 4A is a schematic plan view illustrating the P-channel MOS transistor. As illustrated in FIG. 4B, a phenomenon occurs that a threshold voltage of the P-channel MOS transistor 101 reduces as distances S between a channel region 9 of the P-channel MOS transistor 101 and the N-type well region 6 reduce. This is because an impurity concentration of a portion of the N-type well region which is located close to the boundary between the P-type well region and the N-type well region reduces.

Figure 5:
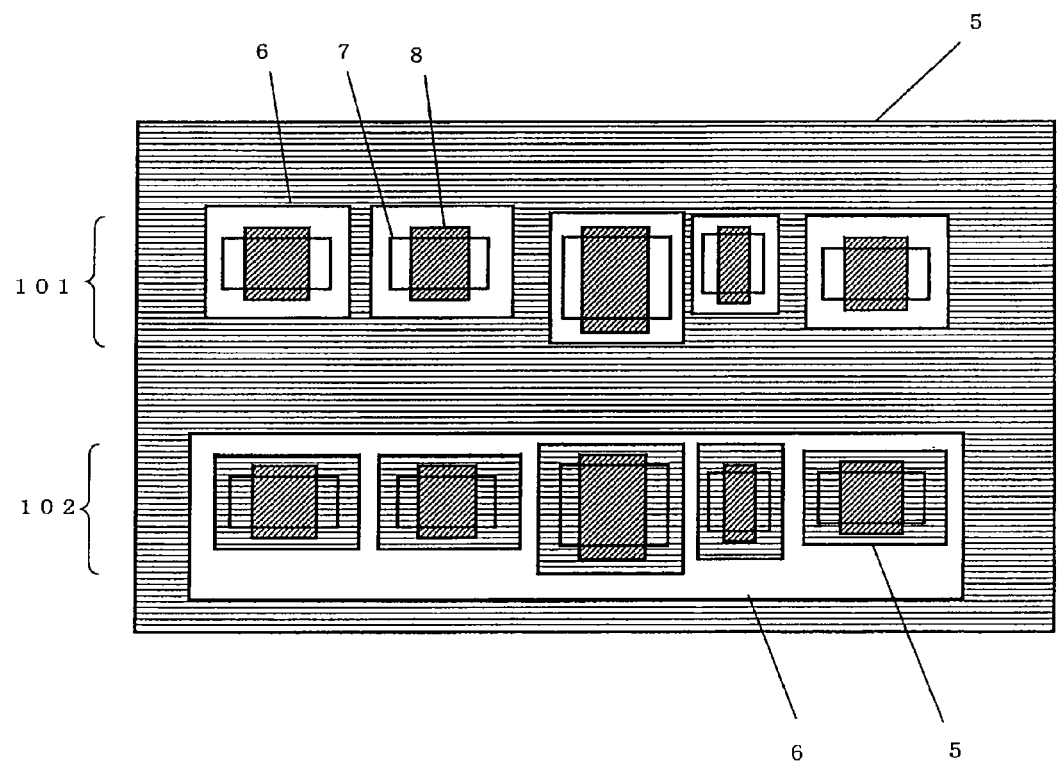
FIG. 5 is a schematic plan view illustrating a semiconductor integrated circuit device according to a second embodiment of the present invention.

FIG. 5 is a schematic plan view illustrating a semiconductor integrated circuit device according to a second embodiment of the present invention. In this embodiment, as in the case of the N-type well regions located in the P-type semiconductor substrate, the respective P-type well regions are provided for corresponding N-channel MOS transistors. In order to realize this, a single N-channel MOS transistor 102 is formed on each of P-type well regions 5. An N-type well region 6 is formed to surround the P-type well regions, to thereby set boundary regions.

The layout as illustrated in FIG. 5 is useful for not only the P-channel MOS transistors but also the N-channel MOS transistors in the analog circuit required to have a high-precision relative ratio between adjacent transistors.

That is, any MOS transistor to which the present invention is applied may be freely selected based on a circuit type such as an analog circuit type or a digital circuit type and required precision during design and layout. A mixed layout may be employed in which the present invention is applied to a part of a circuit region and the conventional example as illustrated in FIG. 2 is applied to a remaining part of the circuit region.

According to the embodiments as described above, the analog circuit required to have the high-precision relative ratio between adjacent transistors may be reduced in size and cost. According to the feature of the present invention, the effects can be obtained by the layouts, and thus the present invention can be applied to an analog circuit process having any specification.

What is claimed is:

1. A semiconductor integrated circuit device, comprising:
a semiconductor substrate having a first conductivity type;
a first well region having the first conductivity type and a plurality of second well regions having a second conductivity type, the first well region and the plurality of second well regions being provided in different regions immediately under a surface of the semiconductor substrate, each of the plurality of second well regions having a well region edge which corresponds to a boundary defining each second well region, wherein at least two adjacent second well regions of the plurality of second well regions are separated by the first well region;
a plurality of first MOS transistors having the second conductivity type which are provided within the first well region having the first conductivity type; and
a plurality of second MOS transistors having the first conductivity type, each of the plurality of second well regions containing only one second MOS transistor, each of the plurality of second MOS transistors having a channel region of the first conductivity type which defines a channel region edge, the channel region edge corresponding to an outer boundary of a channel region;
a lateral distance and a longitudinal distance between the well region edge and the channel region edge in each of the plurality of second MOS transistors respectively measured in a lateral direction and in a longitudinal direction being substantially equal.

2. A semiconductor integrated circuit device according to claim 1, wherein the lateral distance is 2 μm to 5 μm and the longitudinal distance is 2 μm to 5 μm.

* * * * *